(12) United States Patent
Nakamura

(10) Patent No.: US 7,579,260 B2
(45) Date of Patent: Aug. 25, 2009

(54) METHOD OF DIVIDING AN ADHESIVE FILM BONDED TO A WAFER

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 83 days.

(21) Appl. No.: 11/785,167

(22) Filed: Apr. 16, 2007

(65) Prior Publication Data

US 2007/0249145 A1 Oct. 25, 2007

(30) Foreign Application Priority Data

Apr. 25, 2006 (JP) ............................. 2006-120354

(51) Int. Cl.
    *H01L 21/00* (2006.01)
(52) U.S. Cl. .................. 438/464; 438/463; 438/462; 438/460; 438/928; 438/113; 438/110; 438/114; 438/118; 438/458; 257/723; 257/783
(58) Field of Classification Search .............. 438/460, 438/462, 464, 465, 723, 928, 113, 110, 114, 438/118, 458, FOR. 386; 257/723, 782, 257/783
See application file for complete search history.

(56) References Cited

U.S. PATENT DOCUMENTS

| | | | |
|---|---|---|---|
| 6,638,865 B2 | 10/2003 | Tanaka | |
| 6,849,523 B2 * | 2/2005 | Chao et al. ................. | 438/460 |
| 6,939,785 B2 * | 9/2005 | Kajiyama et al. ............ | 438/463 |
| 7,329,564 B2 * | 2/2008 | Nakamura et al. .......... | 438/113 |
| 2004/0266138 A1 * | 12/2004 | Kajiyama et al. ........... | 438/462 |
| 2006/0030129 A1 * | 2/2006 | Ohmiya et al. .............. | 438/462 |
| 2006/0035444 A1 * | 2/2006 | Nakamura et al. .......... | 438/464 |
| 2006/0211220 A1 * | 9/2006 | Sakaya et al. ............... | 438/464 |
| 2007/0128767 A1 * | 6/2007 | Nakamura .................. | 438/113 |
| 2007/0128834 A1 * | 6/2007 | Nakamura .................. | 438/460 |
| 2007/0164073 A1 * | 7/2007 | Watanabe et al. .......... | 225/96.5 |

FOREIGN PATENT DOCUMENTS

| | | |
|---|---|---|
| JP | 2000-182995 | 6/2000 |
| JP | 2002-118081 | 4/2002 |

* cited by examiner

*Primary Examiner*—Thao X Le
*Assistant Examiner*—Thanh Y Tran
(74) *Attorney, Agent, or Firm*—Smith, Gambrell & Russell, LLP

(57) ABSTRACT

A method of dividing an adhesive film for die bonding which is bonded to the rear surface of a wafer having devices in a plurality of areas sectioned by dividing lines formed in a lattice pattern on the front surface, into pieces corresponding to the devices, comprising the steps of putting the adhesive film side of the wafer on the front surface of a dicing tape mounted on an annular frame; cutting the wafer whose adhesive film side has been put on the dicing tape into devices along the dividing lines and cutting the adhesive film incompletely in such a way that an uncut portion is caused to remain; and expanding the dicing tape after the cutting step to divide the adhesive film into pieces corresponding to the devices.

5 Claims, 17 Drawing Sheets (a)

(b)

(a)

(b)

(a)

(b)

(a)

(b)

(a)

(b)

(a)

(b)

(a)

(b)

(c)

(a)

(b)

METHOD OF DIVIDING AN ADHESIVE FILM BONDED TO A WAFER

FIELD OF THE INVENTION

The present invention relates to a method of dividing an adhesive film for die bonding, which is bonded to the rear surface of a wafer having a plurality of devices formed thereon, into pieces corresponding to the devices.

DESCRIPTION OF THE PRIOR ART

In the manufacturing process of a semiconductor device, for example, individual devices are manufactured by forming a device such as IC or LSI in a plurality of areas sectioned by streets (dividing lines) formed in a lattice pattern on the front surface of a substantially disk-like semiconductor wafer and dividing the semiconductor wafer into the areas each having a device formed therein, along the dividing lines. A cutting machine called "dicing machine" is generally used as the dividing machine for dividing the semiconductor wafer to cut the semiconductor wafer along the dividing lines by means of a cutting blade having a thickness of about 40 µm. The thus obtained devices are packaged and widely used in electric appliances such as portable telephones and personal computers.

An adhesive film for die bonding called "die attach film" having a thickness of 70 to 80 µm and made of an epoxy resin is bonded to the rear surfaces of the above individually divided devices which are then bonded to a die bonding frame for supporting the devices through this adhesive film, by heating. As a means of bonding the adhesive film for die bonding to the rear surface of a device, JP-A 2000-182995 discloses a method in which, after the adhesive film is bonded to the rear surface of a semiconductor wafer and the semiconductor wafer is put on a dicing tape through this adhesive film, the semiconductor wafer is cut by means of a cutting blade together with the adhesive film, along dividing lines formed on the front surface of the semiconductor wafer to obtain semiconductor chips having the adhesive film on the rear surface.

As another means of bonding an adhesive film for die bonding to the rear surface of a device, there is proposed a method in which, after the adhesive film is bonded to the rear surface of a semiconductor wafer and the semiconductor wafer is put on a dicing tape through this adhesive film, a laser beam is applied along dividing lines formed on the front surface of the semiconductor wafer, thereby dividing the adhesive film together with the semiconductor wafer.

Due to recent growing demand for lighter and smaller electric appliances such as portable telephones and personal computers, thinner devices are desired. A dividing technique called "pre-dicing" is used to divide a semiconductor wafer into thinner devices. In this pre-dicing technique, dividing grooves having a predetermined depth (corresponding to the final thickness of each semiconductor chip) are formed in the front surface of the semiconductor wafer along the dividing lines and then, exposed to the rear surface by grinding the rear surface of the semiconductor wafer having the dividing grooves formed in the front surface to divide the semiconductor wafer into individual semiconductor chips. This technique makes it possible to obtain semiconductor chips having a thickness of 100 µm or less.

However, when the semiconductor wafer is divided into individual devices by the pre-dicing technique, since after the dividing grooves having a predetermined depth are formed in the front surface of the semiconductor wafer along the dividing lines, the rear surface of the semiconductor wafer is ground to expose the dividing grooves to the rear surface, the adhesive film for die bonding cannot be bonded to the rear surface of the semiconductor wafer beforehand. Therefore, to bond the semiconductor chips manufactured by the pre-dicing technique to a die bonding frame, it must be carried out while inserting a bonding agent between the devices and the die bonding frame and consequently, a problem arises that it makes it impossible to carry out bonding work smoothly.

To solve the above problem, JP-A 2002-118081 discloses a semiconductor device manufacturing process comprising bonding an adhesive film for die bonding to the rear surface of a semiconductor wafer which has been divided into individual devices by the pre-dicing technique, putting the semiconductor wafer on a dicing tape through this adhesive film, and chemically etching the adhesive film exposed from the spaces between adjacent semiconductor chips to remove it, as well as a semiconductor device manufacturing process comprising applying a laser beam to the adhesive film exposed from the spaces between adjacent devices on the front surfaces of the semiconductor chips through the above spaces so as to remove portions exposed from the above spaces of the adhesive film.

When the adhesive film bonded to the rear surface of the semiconductor wafer is cut completely by means of the cutting blade together with the semiconductor wafer, whisker-like burrs are produced on the rear surface of the adhesive film and cause disconnection at the time of wire bonding.

When the adhesive film is cut by applying a laser beam thereto, it is molten and adheres to the dicing tape, thereby making it impossible to pick up the semiconductor chips from the dicing tape.

SUMMARY OF THE INVENTION

It is an object of the present invention to provide a method of dividing an adhesive film bonded to a wafer, which is capable of dividing the adhesive film bonded to the rear surface of the wafer without producing burrs or allowing the adhesive film to adhere to a dicing tape.

To attain the above object, according to the present invention, there is provided a method of dividing an adhesive film for die bonding, which is bonded to the rear surface of a wafer having devices in a plurality of areas sectioned by dividing lines formed in a lattice pattern on the front surface, into pieces corresponding to the devices, comprising the steps of:

putting the adhesive film side of the wafer on the front surface of a dicing tape mounted on an annular frame;

cutting the wafer whose adhesive film side has been put on the dicing tape, into devices along the dividing lines and cutting the adhesive film incompletely in such a way that an uncut portion is caused to remain; and expanding the dicing tape after the cutting step to divide the adhesive film into pieces corresponding to the devices.

The above cutting step is carried out by using a cutting machine having a cutting blade or a laser beam processing machine for applying a pulse laser beam.

The thickness of the uncut portion of the adhesive film is set to 20 µm or less in the cutting step.

Preferably, the adhesive film dividing step is to expand the dicing tape by cooling the adhesive film to reduce its elasticity.

According to the present invention, there is also provided a method of dividing an adhesive film for die bonding, which is bonded to the rear surface of a wafer divided into a plurality of devices, into pieces corresponding to the devices, comprising the steps of:

putting the adhesive film side of the wafer on the front surface of a dicing tape mounted on an annular frame;

cutting the adhesive film bonded to the dicing tape into pieces corresponding to the devices incompletely in such a way that an uncut portion is caused to remain; and expanding the dicing tape after the cutting step to divide the adhesive film into pieces corresponding to the devices.

The above cutting step is carried out by using a laser beam processing machine for applying a pulse laser beam.

The thickness of the uncut portion of the adhesive film is set to 20 μm or less in the cutting step.

Preferably, the above adhesive film dividing step is to expand the dicing tape by cooling the adhesive film to reduce its elasticity.

According to the present invention, since the adhesive film bonded to the rear surface of the wafer is cut incompletely in such a way that an uncut portion is caused to remain, in the cutting step, when it is cut with the cutting blade, burrs are not produced on the rear surface of the adhesive film. When the cutting step is carried out by applying a laser beam, as the adhesive film is cut incompletely in such a way that an uncut portion is caused to remain, the adhesive film does not adhere to the dicing tape.

According to the present invention, since the adhesive film bonded to the rear surface of the wafer is cut incompletely in such a way that an uncut portion is caused to remain, in the cutting step, the adhesive film can be divided into pieces corresponding to the devices by expanding the dicing tape in the adhesive film dividing step.

DETAILED DESCRIPTION OF THE PREFERRED EMBODIMENTS

Preferred embodiments of the present invention will be described in detail hereinunder with reference to the accompanying drawings.

Figure 1:
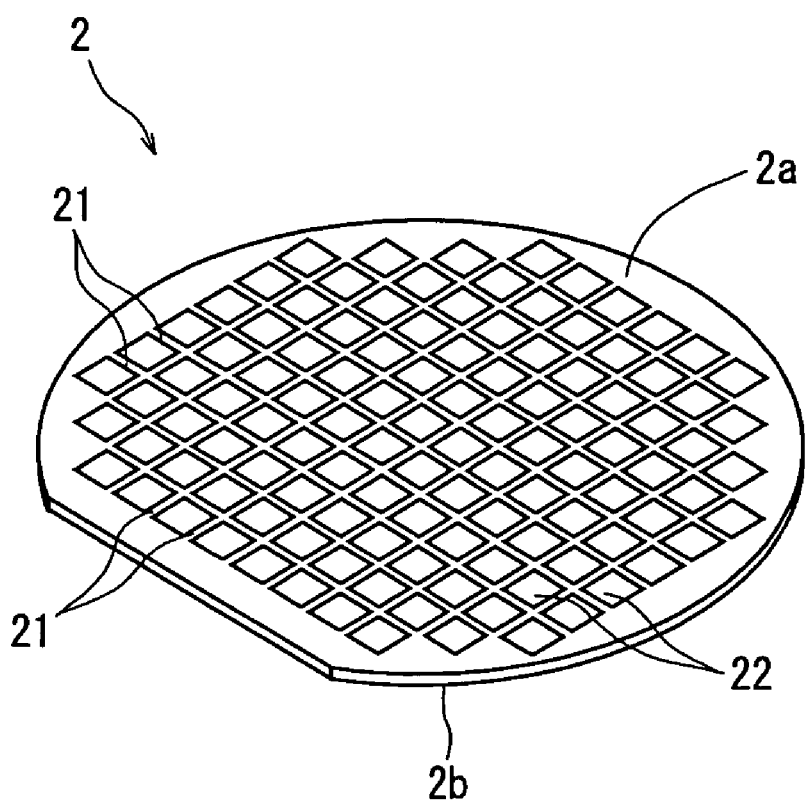
FIG. 1 is a perspective view of a semiconductor wafer as the wafer.

FIG. 1 is a perspective view of a semiconductor wafer as the wafer. The semiconductor wafer 2 shown in FIG. 1 is, for example, a silicon wafer having a thickness of 300 μm, and a plurality of dividing lines 21 are formed in a lattice pattern on the front surface 2a thereof. Each of devices 22 such as IC or LSI is formed in a plurality of areas sectioned by the plurality of dividing lines 21 formed in a lattice pattern on the front surface 2a of the semiconductor wafer 2.

Figure 2:
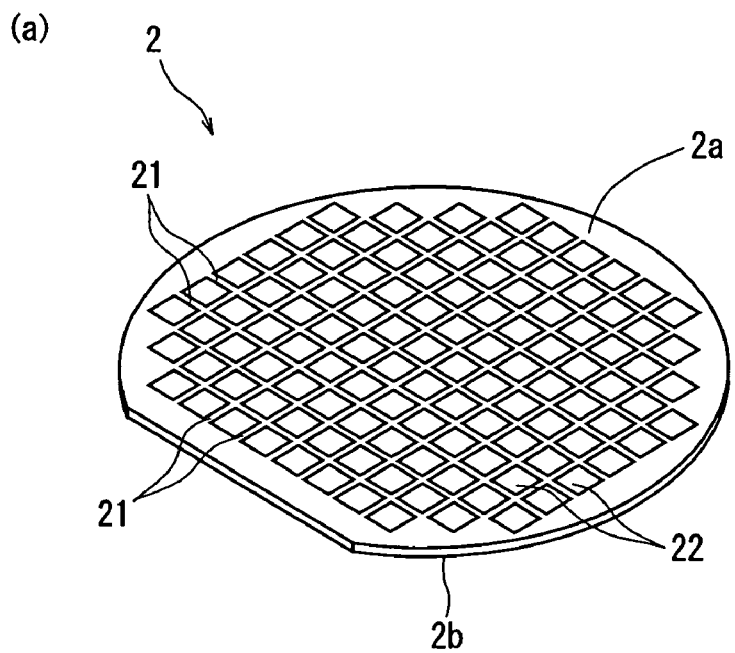
FIGS. 2(a) and 2(b) are explanatory diagrams showing the adhesive film bonding step in the method of dividing an adhesive film bonded to a wafer according to the present invention.
Figure 2:
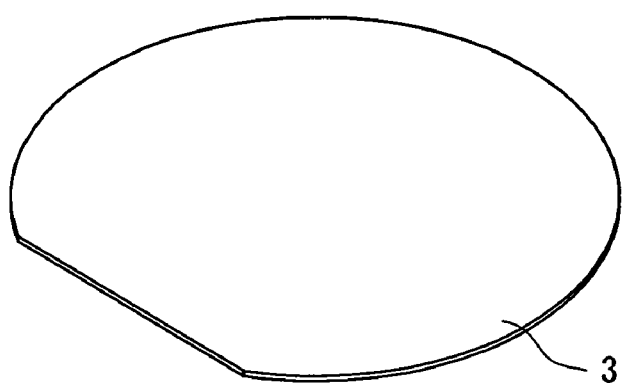
Figure 2:
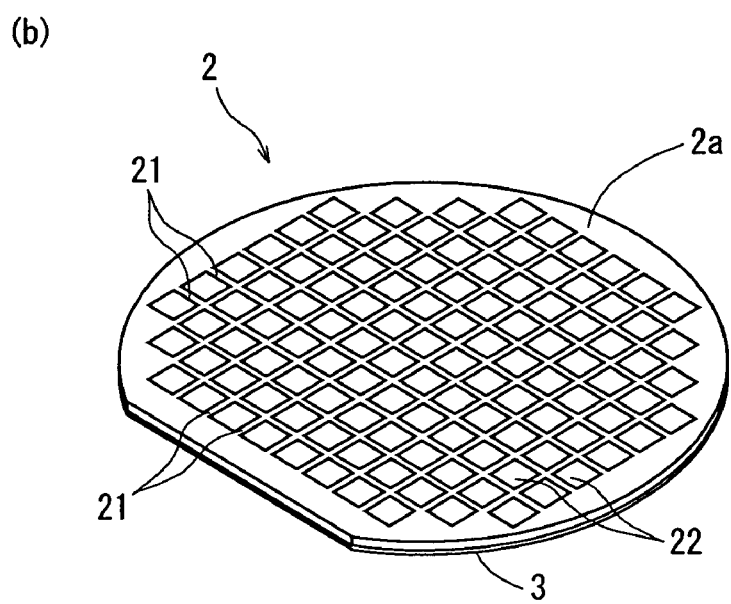

An adhesive film 3 for die bonding is bonded to the rear surface 2b of the above semiconductor wafer 2 as shown in FIGS. 2(a) and 2(b) (adhesive film bonding step). At this point, the adhesive film 3 is pressed against the rear surface 2b of the semiconductor wafer 2 under heating at 80 to 200° C. to be bonded to the rear surface 2b. The adhesive film 3 is made of a film material composed of a mixture of an epoxy resin and an acrylic resin, and has a thickness of about 90 μm in the illustrated embodiment.

Figure 3:
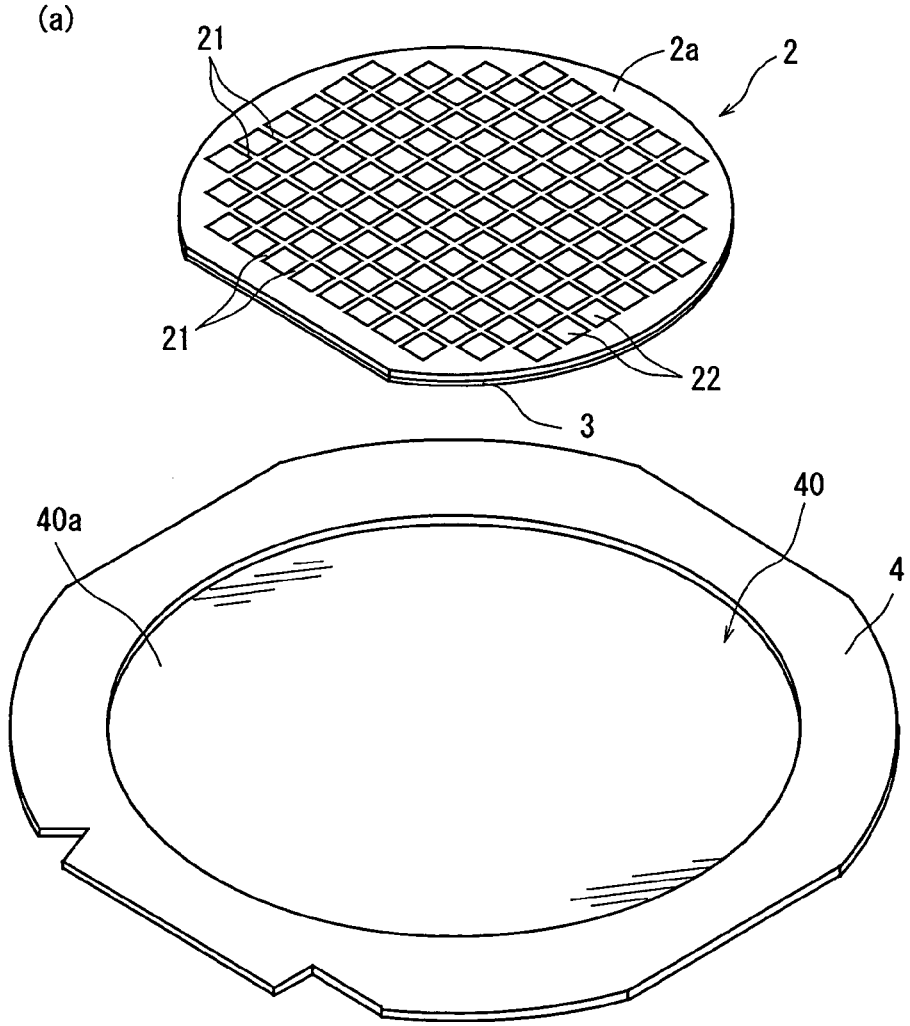
FIGS. 3(a) and 3(b) are perspective views of the wafer showing the wafer supporting step in the method of dividing an adhesive film bonded to a wafer according to the present invention.
Figure 3:
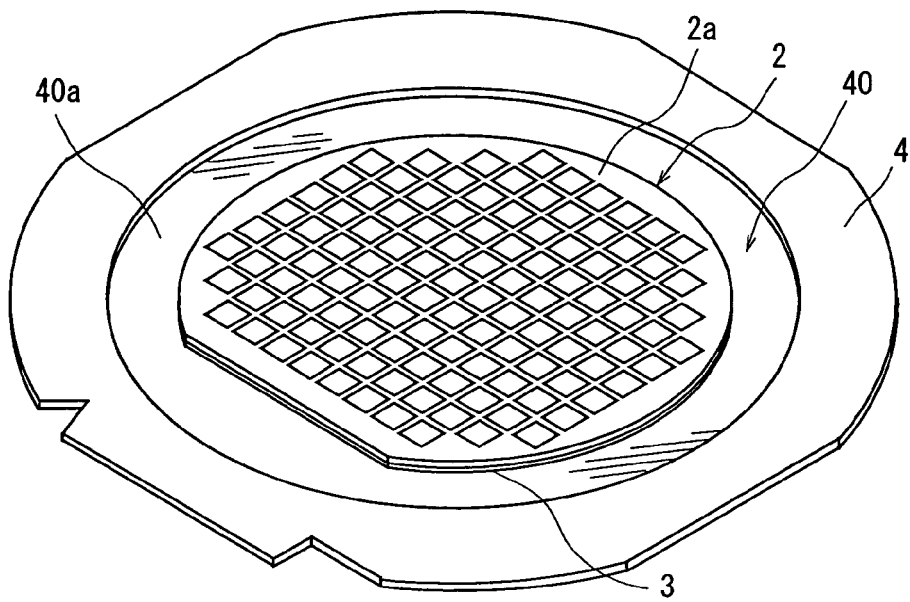

After the adhesive film bonding step, as shown in FIGS. 3(a) and 3(b), the adhesive film 3 side of the semiconductor wafer 2 is put on the front surface 40a of a dicing tape 40 whose peripheral portion is mounted on an annular frame 4 to cover its inner opening (wafer supporting step). The above dicing tape 40 has an about 5 μm-thick acrylic resin-based adhesive coating layer coated on the surface of a 80 μm-thick sheet substrate made of polyvinyl chloride (PVC) in the illustrated embodiment.

Other examples of the adhesive film bonding step and the wafer supporting step will be described with reference to FIGS. 4(a) and 4(b).

Figure 4:
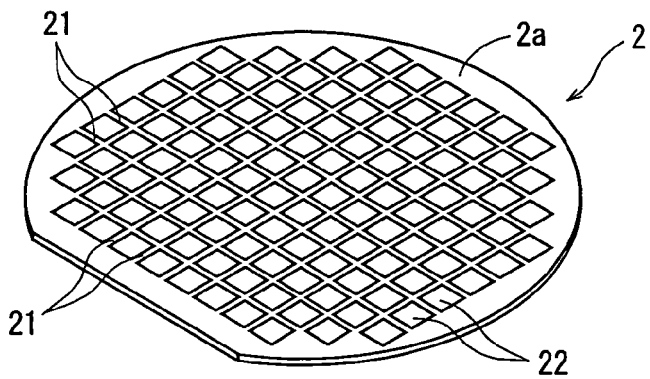
FIGS. 4(a) and 4(b) are explanatory diagrams showing other examples of the adhesive film bonding step and the wafer supporting step in the method of dividing an adhesive film bonded to a wafer according to the present invention.
Figure 4:
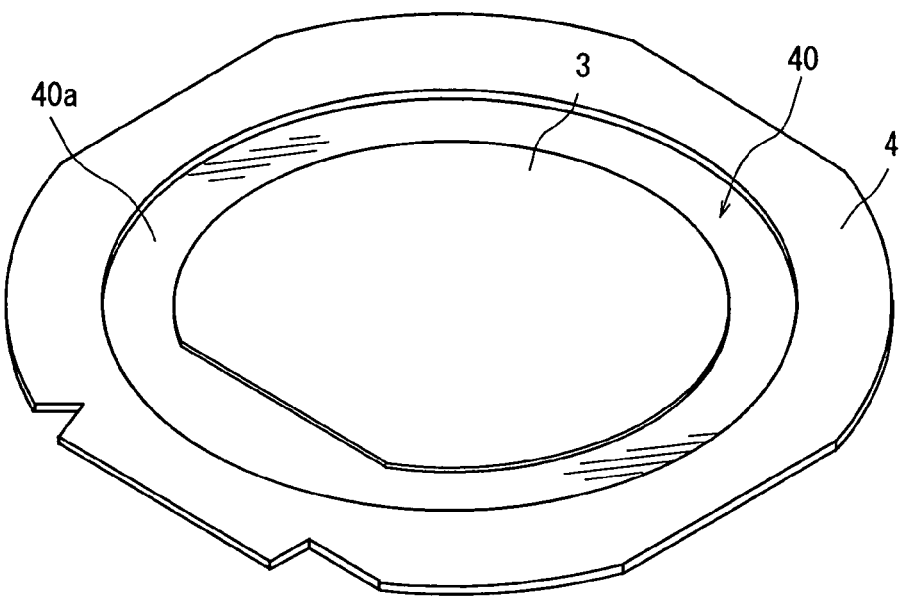
Figure 4:
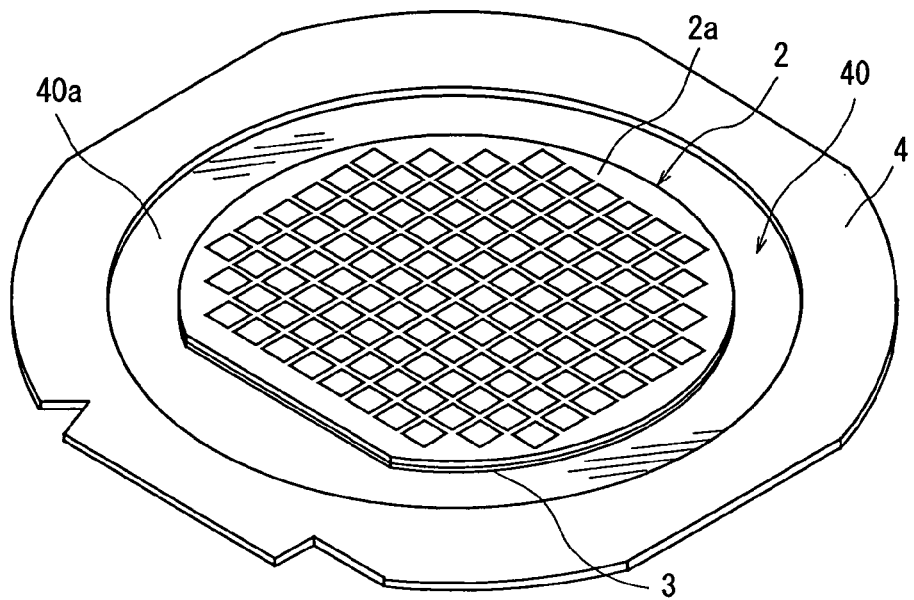

In the embodiment shown in FIGS. 4(a) and 4(b), a dicing tape having an adhesive film bonded to the front surface beforehand is used. That is, as shown in FIGS. 4(a) and 4(b), the adhesive film 3 affixed to the front surface 40a of the dicing tape 40 whose peripheral portion is mounted on the annular frame 4 to cover its inner opening is bonded to the rear surface 2b of the semiconductor wafer 2. At this point, the adhesive film 3 is pressed against the rear surface 2b of the semiconductor wafer 2 under heating at 80 to 200° C. to be bonded to the rear surface 2b. A dicing tape having an adhesive film (LE5000) manufactured by Lintec Corporation may be used as the dicing tape having an adhesive film.

Figure 5:
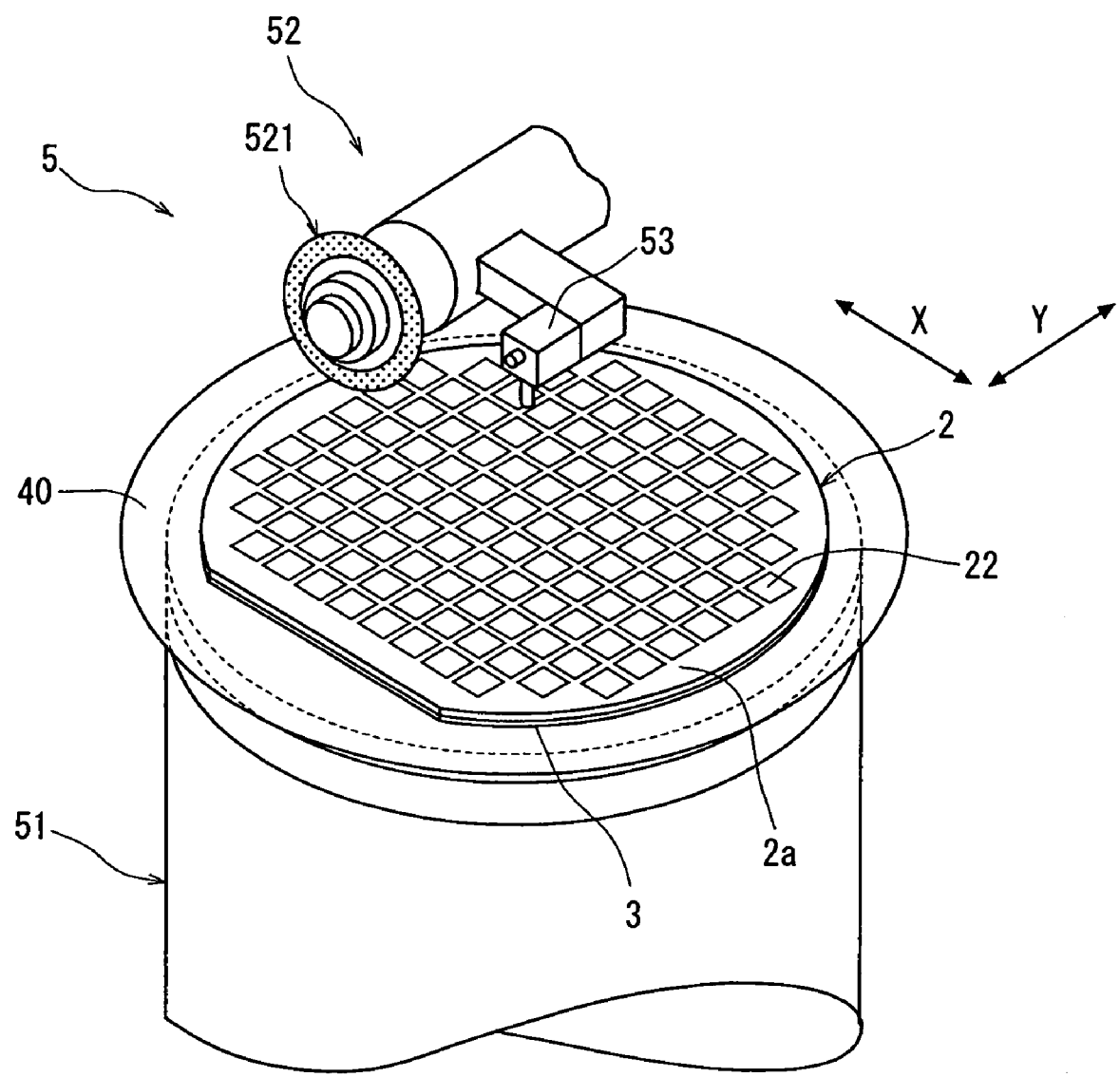
FIG. 5 is a perspective view of the principal portion of a cutting machine for carrying out the cutting step in the method of dividing an adhesive film bonded to a wafer according to the present invention.

After the above adhesive film bonding step and the above wafer supporting step, next comes the step of cutting the wafer 2 whose adhesive film 3 side has been put on the dicing tape 40, along the dividing lines 21 into devices incompletely in such a way that an uncut portion is caused to remain, of the adhesive film 3. This cutting step is carried out by using a cutting machine shown in FIG. 5 in this embodiment. The cutting machine 5 shown in FIG. 5 comprises a chuck table 51 having a suction-holding means, a cutting means 52 having a cutting blade 521 and an image pick-up means 53. To carry out the cutting step, the dicing tape 40 affixed to the adhesive film 3 side of the wafer 2 in the above wafer supporting step is placed on the chuck table 51. The wafer 2 is held on the chuck table 51 through the dicing tape 40 by activating a suction means that is not shown. Although the annular frame 4 on which the dicing tape 40 has been mounted is not shown in FIG. 5, the annular frame 4 is held by a suitable frame holding means provided on the chuck table 51. The chuck table 51 suction-holding the semiconductor wafer 2 is brought to a position right below the image pick-up means 53 by a cutting-feed mechanism that is not shown.

After the chuck table 51 is positioned right below the image pick-up means 53, the alignment step for detecting the area to be cut of the semiconductor wafer 2 is carried out by the image pick-up means 53 and a control means that is not shown. That is, the image pick-up means 53 and the control means (not shown) carry out image processings such as pattern matching etc., to align a dividing line 21 formed in the predetermined direction of the wafer 2 with the cutting blade 521, thereby performing the alignment of a cutting area (alignment step). The alignment of the cutting area is also carried out on dividing lines 21 formed on the wafer 2 in a direction perpendicular to the above predetermined direction.

Figure 6:
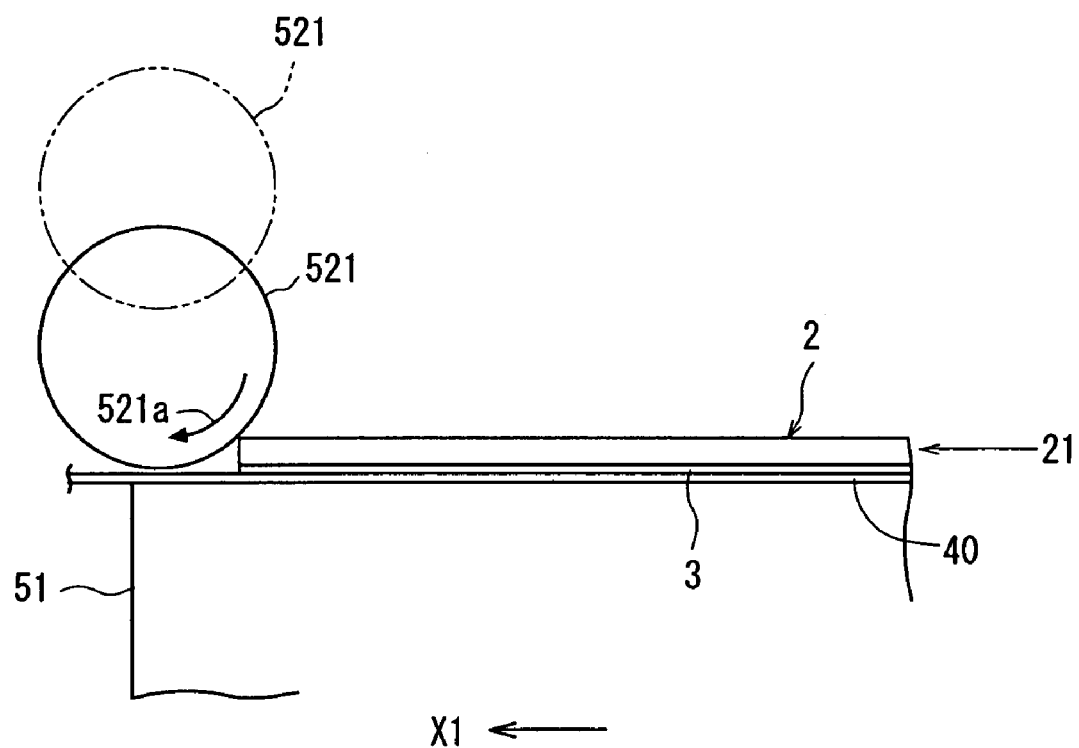
FIG. 6 is an explanatory diagram showing a state in which the cutting step in the method of dividing an adhesive film bonded to a wafer according to the present invention is carried out by using the cutting machine shown in FIG. 5.

After the alignment of the cutting area is carried out by detecting the dividing line 21 formed on the semiconductor wafer 2 held on the chuck table 51 as described above, the chuck table 51 holding the semiconductor wafer 2 is moved to the cutting start position of the cutting area. At this point, as shown in FIG. 6, the semiconductor wafer 2 is positioned such that one end (left end in FIG. 6) of the dividing line 21 to be cut is located on the right side of a position right below the cutting blade 621 and a predetermined distance away from the position. The cutting blade 521 is then rotated at a predetermined revolution in a direction shown by an arrow 521a in FIG. 6 and moved down (cutting-in fed) as shown by a solid line in FIG. 6 by a cutting-in feed mechanism (not shown) from a standby position shown by a two-dotted chain line. This cutting-in position is set to a position 90 μm above the standard position where the outer peripheral end of the cutting blade 521 comes into contact with the front surface of the chuck table 51 in the illustrated embodiment. Since the thickness of the dicing tape 40 is set to 80 μm in the illustrated embodiment, the periphery of the cutting blade 521 passes 10 μm above the front surface of the dicing tape 40.

After the cutting blade 521 is moved down as described above, the chuck table 51 is moved in a direction shown by an arrow X1 in FIG. 6 at a predetermined cutting-feed rate while the cutting blade 521 is rotated at a predetermined revolution in the direction shown by the arrow 521a in FIG. 6 (cutting step). When the right end of the semiconductor wafer 2 held on the chuck table 51 passes right below the cutting blade 521, the movement of the chuck table 51 is stopped.

The above cutting step is carried out under the following processing conditions, for example.

Cutting blade: outer diameter of 52 mm, thickness of 40 μm

Revolution of cutting blade: 40,000 rpm

Cutting-feed rate: 50 mm/sec

Figure 7:
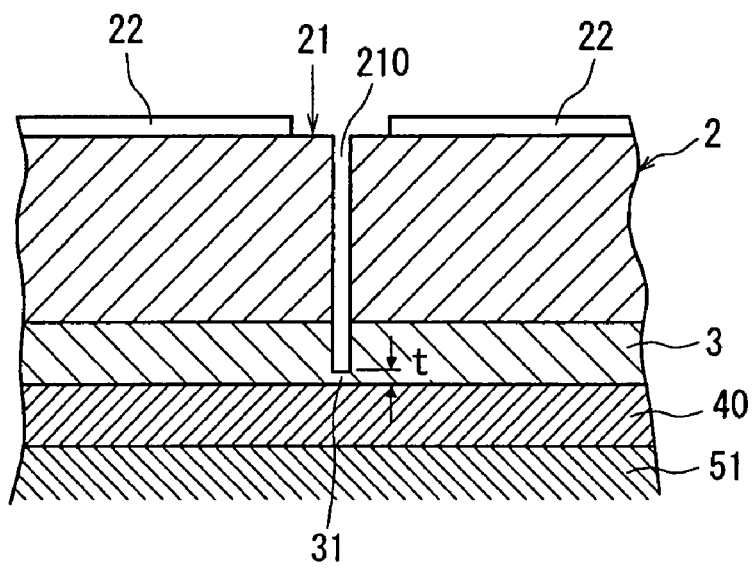
FIG. 7 is an enlarged sectional view of a semiconductor wafer which has been subjected to the cutting step shown in FIG. 6.

The above cutting step is carried out on all the dividing lines 21 formed on the semiconductor wafer 2. As a result, as shown in FIG. 7, a groove 210 is formed along the dividing lines 21 in the semiconductor wafer 2 and the adhesive film 3, the wafer 2 is cut along each of the dividing lines 21, and the adhesive film is cut incompletely in such a way that an uncut portion 31 is caused to remain. The thickness "t" of this uncut portion 31 is 10 μm in the illustrated embodiment. The thickness "t" of this uncut portion 31 is desirably 20 μm or less. Since this adhesive film 3 is cut incompletely, leaving the uncut portion 31 in this cutting step, burrs are not produced on the rear surface of the adhesive film 3.

A description will be subsequently given of another example of the cutting step with reference to FIGS. 8 to 10.

Figure 8:
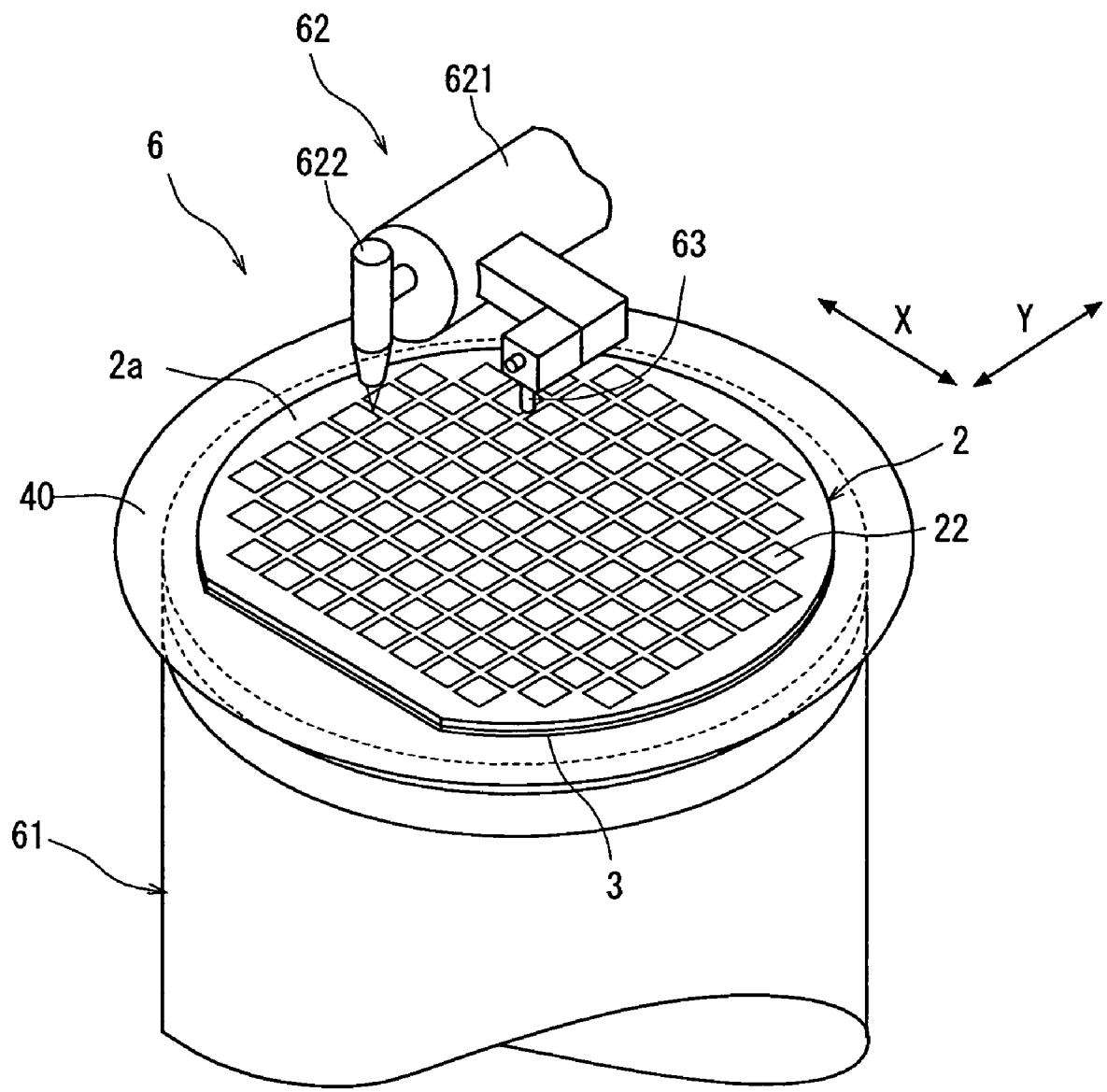
FIG. 8 is a perspective view of the principal portion of a laser beam processing machine for carrying out the cutting step in the method of dividing an adhesive film bonded to a wafer according to the present invention.

In this cutting step, a laser beam processing machine 6 shown in FIG. 8 is used. The laser beam processing machine 6 shown in FIG. 8 comprises a chuck table 61 for holding a workpiece, a laser beam application means 62 for applying a laser beam to the workpiece held on the chuck table 61, and an image pick-up means 63 for picking up an image of the workpiece held on the chuck table 61. The chuck table 61 is so designed as to suction-hold the workpiece and to be moved in a processing-feed direction shown by an arrow X and an indexing-feed direction shown by an arrow Y in FIG. 8 by a moving mechanism that is not shown.

The above laser beam application means 62 comprises a cylindrical casing 621 arranged substantially horizontally. In the casing 621, there is installed a pulse laser beam oscillation means (not shown) which comprises a pulse laser beam oscillator composed of a YAG laser oscillator or YVO4 laser oscillator and a repetition frequency setting means. A condenser 622 for converging a pulse laser beam oscillated from the pulse laser beam oscillation means is attached to the end of the above casing 621. The image pick-up means 63 mounted on the end portion of the casing 621 constituting the above laser beam application means 62 comprises an ordinary image pick-up device (CCD) for picking up an image with visible radiation in the illustrated embodiment. An image signal is supplied to a control means that is not shown.

The step of cutting the wafer 2 whose adhesive film 3 side has been put on the dicing tape 40 as shown in FIGS. 3(a) and 3(b) and FIGS. 4(a) and 4(b), into devices along the dividing lines 21 with the above laser beam processing machine 6 and cutting the adhesive film 3 incompletely in such a way that an uncut portion is caused to remain will be described with reference to FIGS. 8 to 10.

The dicing tape 40 affixed to the adhesive film 3 side of the semiconductor wafer 2 is first placed on the chuck table 61 of the laser beam processing machine 6 shown in FIG. 8. By activating a suction means (not shown), the semiconductor wafer 2 is held on the chuck table 61 through the dicing tape 40. Although the annular frame 4, on which the dicing tape 4 is mounted, is not shown in FIG. 8, it is held by a suitable frame holding means provided on the chuck table 61. The chuck table 61 suction-holding the semiconductor wafer 2 is brought to a position right below the image pick-up means 63 by a moving mechanism that is not shown.

After the chuck table 61 is positioned right below the image pick-up means 63, alignment work for detecting the area to be processed of the semiconductor wafer 2 is carried out by the image pick-up means 63 and a control means that is not shown. That is, the image pick-up means 63 and the control means (not shown) carry out image processings such as pattern matching etc., to align a dividing line 21 formed in a predetermined direction of the wafer 2 with the condenser 622 of the laser beam application means 62 for applying a laser beam along the dividing line 21, thereby performing the alignment of a laser beam application position (alignment step). The alignment of the laser beam application position is also carried out on dividing lines 21 formed on the semiconductor wafer 2 in a direction perpendicular to the above predetermined direction.

Figure 9:
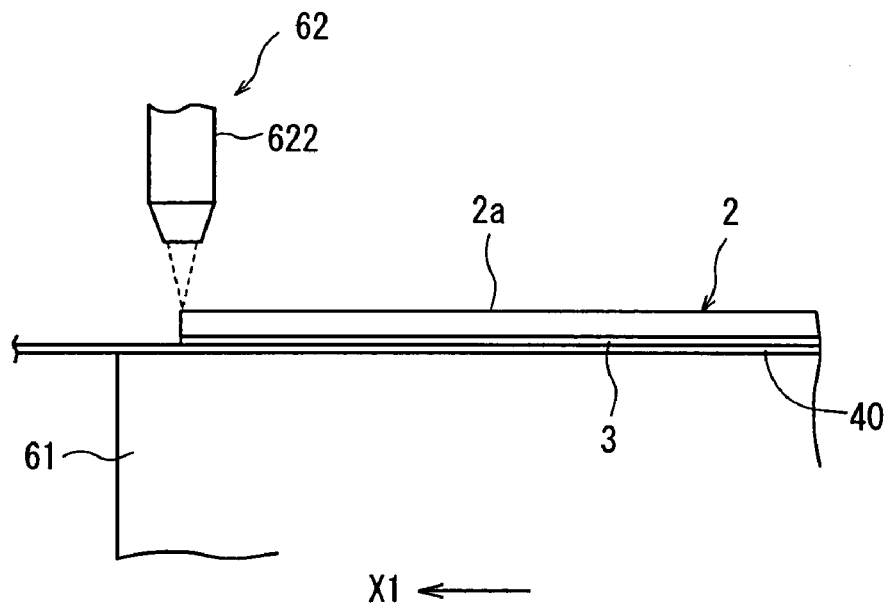
FIG. 9 is an explanatory diagram showing a state in which the cutting step in the method of dividing an adhesive film bonded to a wafer according to the present invention is carried out by using the laser beam processing machine shown in FIG. 8.
Figure 10:
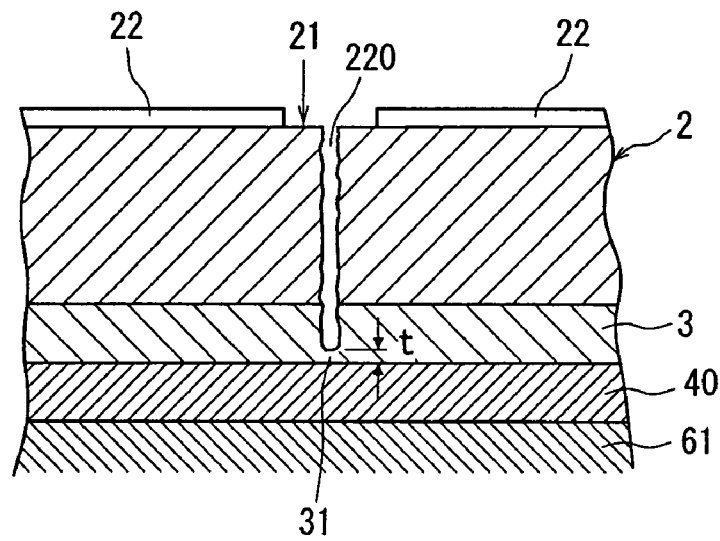
FIG. 10 is an enlarged sectional view of the semiconductor wafer which has been subjected to the cutting step shown in FIG. 9.

After the alignment of the laser beam application position is carried out by detecting the dividing line 21 formed on the semiconductor wafer 2 held on the chuck table 61 as described above, the chuck table 61 is moved to a laser beam application area where the condenser 622 of the laser beam application means 62 is located so as to bring one end (left end in FIG. 9) of the predetermined dividing line 21 to a position right below the condenser 622 of the laser beam application means 62 as shown in FIG. 9. The chuck table 61 is then moved in the direction shown by the arrow X1 in FIG. 9 at a predetermined processing-feed rate while a pulse laser beam of a wavelength having absorptivity for a silicon wafer is applied from the condenser 622 (cutting step). When the application position of the condenser 622 of the laser beam application means 62 reaches the other end (right end in FIG. 9) of the dividing line 21, the application of the pulse laser beam is suspended and the movement of the chuck table 61 is stopped.

The above cutting step is carried out under the following processing conditions, for example.

Light source of laser beam: YVO4 laser or YAG laser
Wavelength: 355 nm
Repetition frequency: 20 kHz
Average output: 3 W
Diameter of focal spot: 5 μm
Processing-feed rate: 100 mm/sec Since a groove having a depth of about 50 μm is formed by one time of the processing step under the above processing conditions, the semiconductor wafer 2 is cut by repeating the above cutting step 6 times, and further, a groove having a depth of about 80 μm can be formed in the adhesive film 3 by further carrying out the above cutting step once. As a result, a groove 220 is formed along the dividing line 21 in the semiconductor wafer 2 and the adhesive film 3 as shown in FIG. 10, the wafer 2 is cut into the devices 22, and the adhesive film 3 is cut incompletely in such a way that an uncut portion 31 is caused to remain. The thickness "t" of the uncut portion 31 is 10 μm in the illustrated embodiment. The thickness "t" of the uncut portion 31 is desirably 20 μm or less. Since the adhesive film 3 is cut incompletely, leaving the uncut portion 31 in this cutting step, the adhesive film 3 does not adhere to the dicing tape 40.

The above cutting step is carried out on all the dividing lines 21 formed on the semiconductor wafer 2.

After the cutting step, next comes the step of dividing the adhesive film 3 into pieces corresponding to the devices by expanding the dicing tape 40 bonded to the adhesive film 3 side of the semiconductor wafer 2. This adhesive film dividing step is carried out by using a tape expanding apparatus 7 shown in FIG. 11 in the illustrated embodiment. The tape expanding apparatus 7 shown in FIG. 11 comprises a frame holding means 71 for holding the above annular frame 4 and a tape expanding means 72 for expanding the dicing tape 40 mounted on the annular frame 4 held on the frame holding means 71. The frame holding means 71 comprises an annular frame holding member 711 and a plurality of clamps 712 as a fixing means arranged around the frame holding member 711. The top surface of the frame holding member 711 forms a placing surface 711a for placing the annular frame 4, and the annular frame 4 is placed on this placing surface 711a. The annular frame 4 placed on the placing surface 711a is fixed on the frame holding member 711 by the clamps 712. The thus constituted frame holding means 71 is supported by the tape expanding means 72 in such a manner that it can move in the vertical direction.

The tape expanding means 72 has an expansion drum 721 arranged within the above annular frame holding member 711. This expansion drum 721 has a smaller outer diameter than the inner diameter of the annular frame 4 and a larger inner diameter than the outer diameter of the wafer 2 on the dicing tape 40 mounted on the annular frame 4. The expansion drum 721 has a support flange 722 at the lower end. The tape expanding means 72 in the illustrated embodiment comprises a support means 73 capable of moving the above annular frame holding member 711 in the vertical direction. This support means 73 comprises a plurality of air cylinders 731 installed on the above support flange 722, and their piston rods 732 are connected to the undersurface of the above annular frame holding member 711. The support means 73 comprising the plurality of air cylinders 731 moves the annular frame holding member 711 in the vertical direction between a standard position where the placing surface 711a becomes substantially flush with the upper end of the expansion drum 721 and an expansion position where the placing surface 711a is positioned below the upper end of the expansion drum 721 by a predetermined distance. Therefore, the support means 73 comprising the plurality of air cylinders 731 functions as an expanding and moving means for moving the expansion drum 721 and the frame holding member 711 relative to each other in the vertical direction.

The adhesive film dividing step which is carried out by using the tape expanding apparatus 7 constituted as described above will be described with reference to FIGS. 12(a) and 12(b). That is, the annular frame 4, on which the dicing tape 40 affixed to the adhesive film 3 side of the semiconductor wafer 2 (the grooves 220 are formed along the dividing lines 21) is mounted, is placed on the placing surface 711a of the frame holding member 711 constituting the frame support means 71 and fixed on the frame holding member 711 by the clamps 712, as shown in FIG. 12(a). At this point, the frame holding member 711 is situated at the standard position shown in FIG. 12(a). Then, the annular frame holding member 711 is lowered to the expansion position shown in FIG. 12(b) by activating the plurality of air cylinders 731 as the support means 73 constituting the tape expanding means 72.

Accordingly, as the annular frame 4 fixed on the placing surface 711a of the frame holding member 711 is also lowered, the dicing tape 40 mounted on the annular frame 4 comes into contact with the upper edge of the expansion drum 721 to be expanded as shown in FIG. 12(b) (tape expanding step). As a result, tensile force acts radially on the adhesive film 3 affixed to the dicing tape 40. When tensile force acts radially on the adhesive film 3, as the semiconductor wafer 2 is divided into the individual devices 22 along the dividing lines 21, the interval between adjacent devices 22 is expanded to form a space S. Therefore, as tensile force acts on the adhesive film 3, the adhesive film 3 is divided into pieces corresponding to the devices without fail.

The expansion or elongation of the dicing tape 40 in the above adhesive film dividing step can be adjusted by the amount of the downward movement of the frame holding member 711. According to experiments conducted by the inventors of the present invention, when the dicing tape 40 was stretched about 20 mm, the adhesive film 3 could be divided into pieces corresponding to the devices 22. At this point, the space S between adjacent devices 22 was about 1 mm. Even when the dicing tape 40 is expanded as described above, if the thickness of the adhesive film 3 is 80 to 90 μm, the adhesive film 3 cannot be divided into pieces corresponding to the devices 22 due to the elongation of the adhesive film 3. Therefore, in the present invention, the adhesive film 3 is cut incompletely in the above cutting step and the thickness of the uncut portion 31 is 10 μm, thereby making it possible to divide the adhesive film 3 into pieces corresponding to the devices 22 easily. If the thickness of the above uncut portion 31 is smaller than 20 μm, the adhesive film 3 can be easily divided into pieces corresponding to the devices 22. The moving speed of the annular frame holding member 711 in the tape expanding step is desirably 50 mm/sec or more. Further, the tape expanding step is desirably carried out by cooling the adhesive film 3 to 10° C. or lower to reduce its elasticity.

The method of dividing the adhesive film bonded to the wafer according to another embodiment of the present invention will be described with reference to FIGS. 13 to 20.

In this embodiment, after the semiconductor wafer 2 shown in FIG. 1 is divided into individual devices by the pre-dicing technique, the adhesive film 3 is bonded to the rear surface of the semiconductor wafer 2 and divided into pieces corresponding to the devices. In this case, the thickness of the semiconductor wafer 2 shown in FIG. 1 is 600 μm, for example. A description will be first given of the step of dividing the semiconductor wafer 2 into individual devices by the pre-dicing technique.

Figure 13:
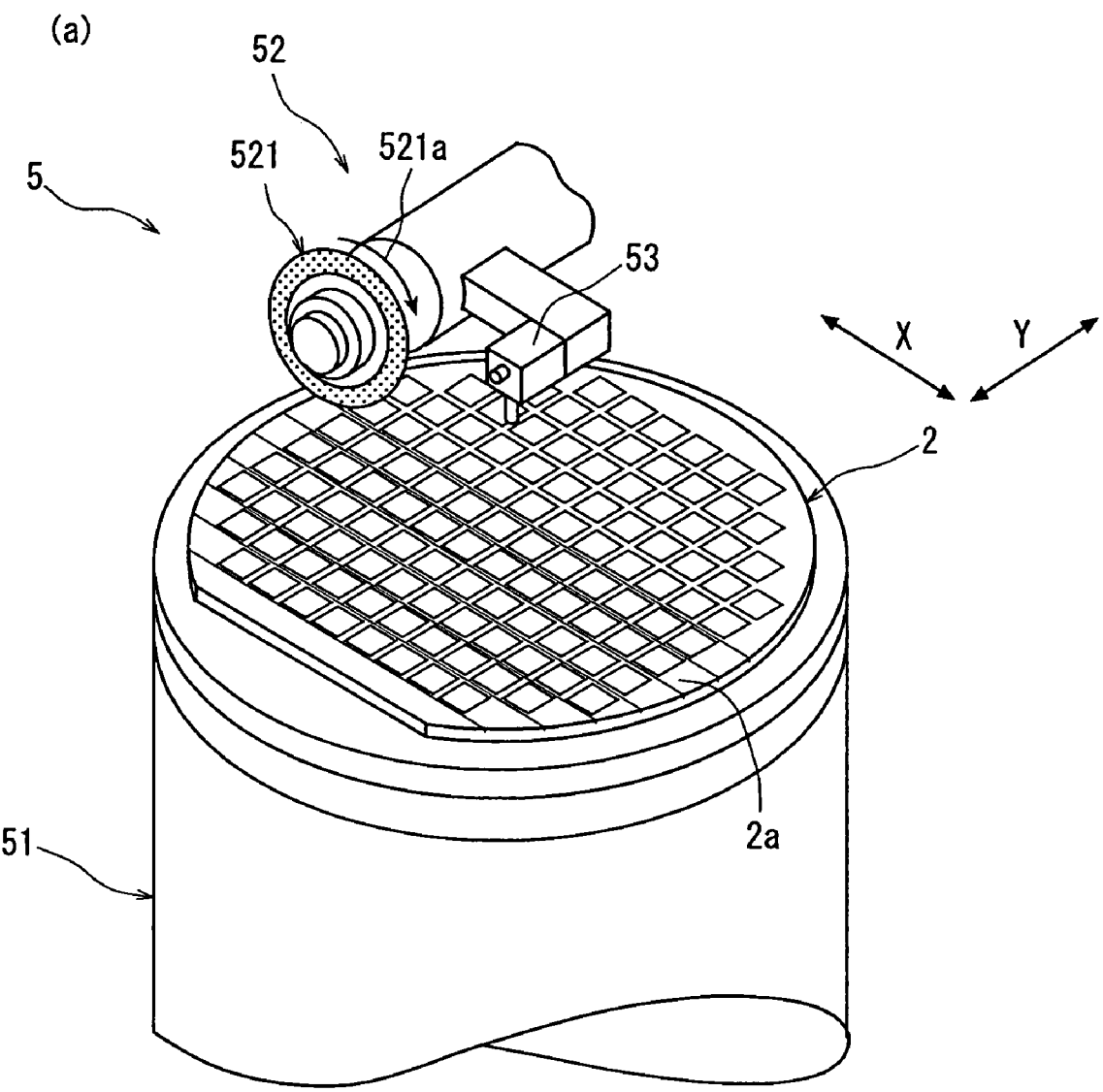
FIGS. 13(a) and 13(b) are explanatory diagrams showing the step of forming a dividing groove having a predetermined depth along dividing lines formed on the front surface of the semiconductor wafer.
Figure 13:
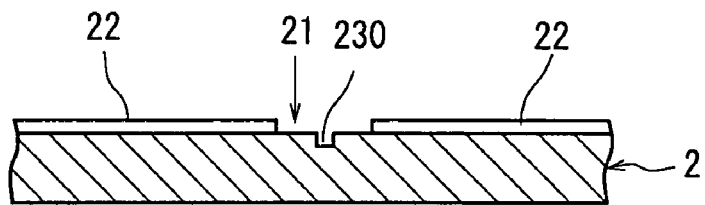
Figure 14:
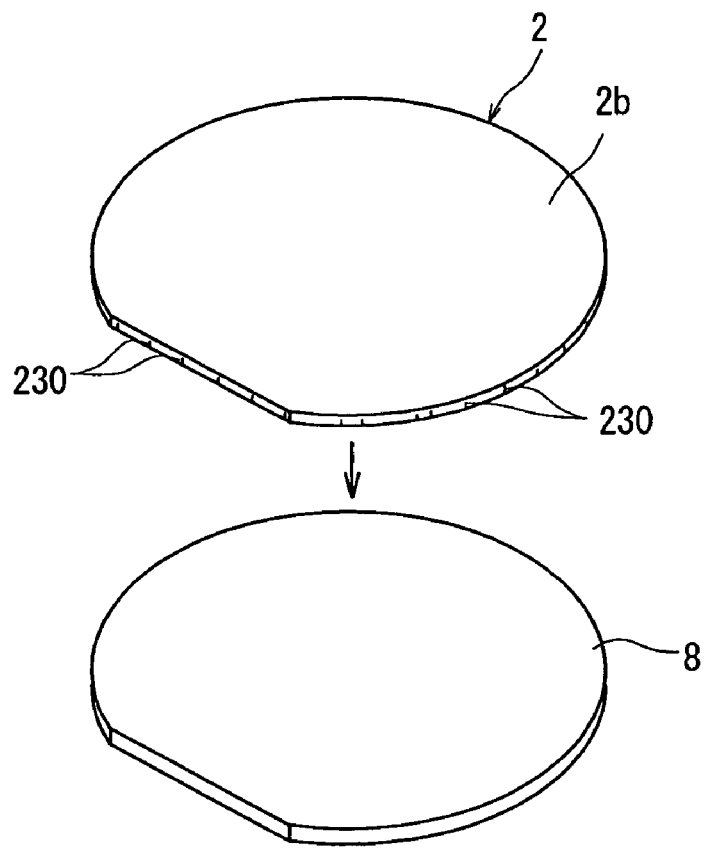
FIGS. 14(a) and 14(b) are explanatory diagrams showing the step of bonding a protective member for grinding to the front surface of the semiconductor wafer.
Figure 14:
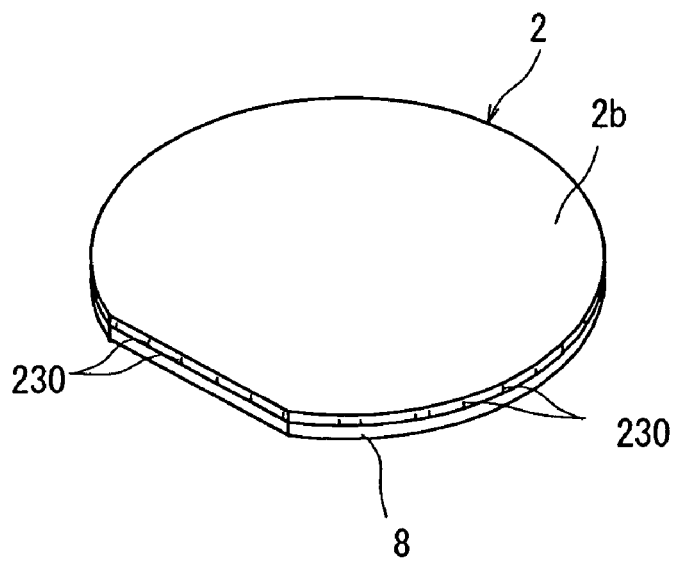
Figure 15:
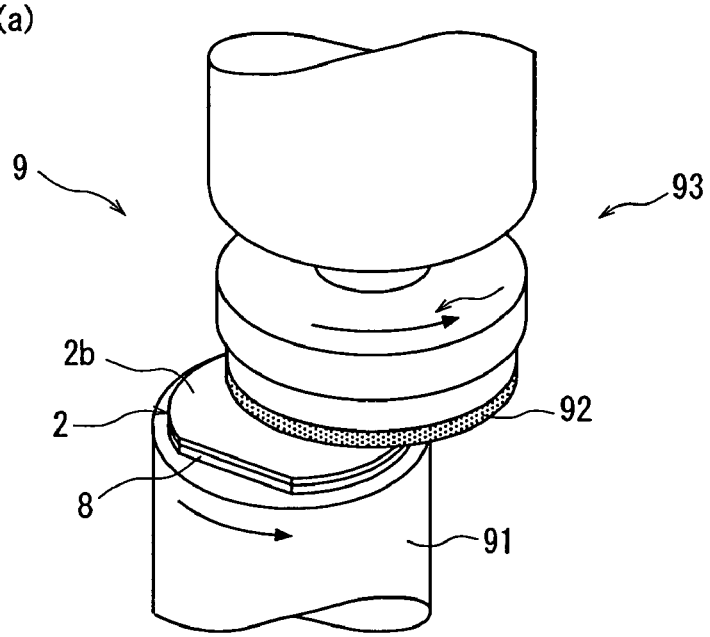
FIGS. 15(a) to 15(c) are explanatory diagrams showing the step of grinding the rear surface of the semiconductor wafer to expose the diving grooves to the rear surface and divide the semiconductor wafer into individual devices.
Figure 15:
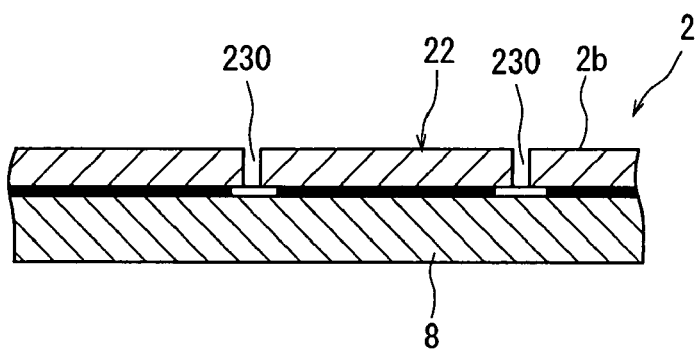
Figure 15:
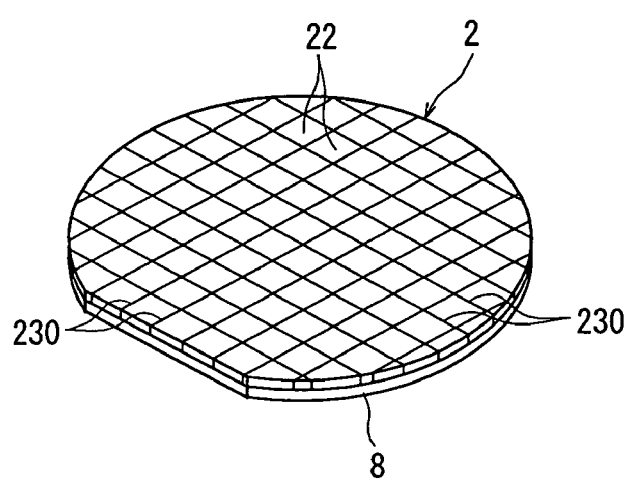
Figure 16:
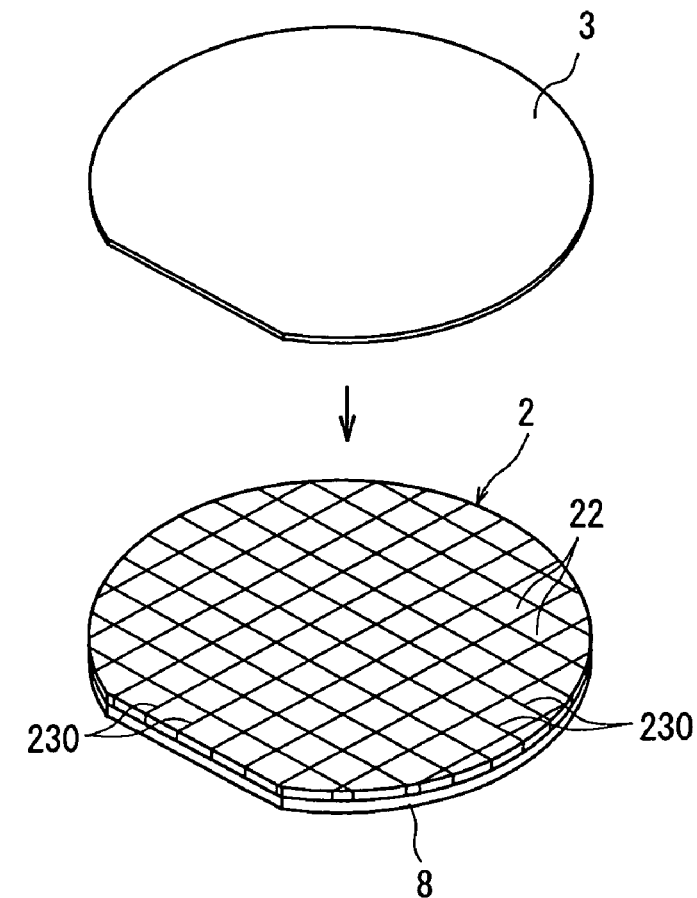
FIGS. 16(a) and 16(b) are explanatory diagrams showing another example of the adhesive film bonding step in the method of dividing an adhesive film bonded to a wafer according to the present invention.
Figure 16:
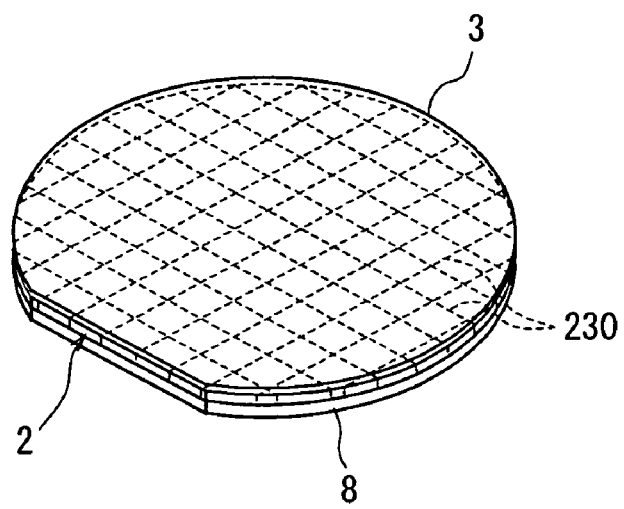

To divide the semiconductor wafer 2 into individual devices by the pre-dicing technique, dividing grooves having a predetermined depth (corresponding to the final thickness of each semiconductor chip) are first formed along the dividing lines 21 formed on the front surface 2a of the semiconductor wafer 2 (dividing groove forming step). This dividing groove forming step can be carried out by using the cutting machine 5 shown in FIG. 13. That is, the semiconductor wafer 2 is placed on the chuck table 51 of this cutting machine 5 in such a manner that the front surface 2a faces up as shown in FIG. 13(a). The wafer 2 is held on the chuck table 51 by activating the suction means that is not shown. The chuck table 51 suction-holding the semiconductor wafer 2 as described above is brought to a position right below the image pick-up means 53 by the cutting-feed mechanism to carry out the above alignment.

After the alignment of the cutting area of the semiconductor wafer 2 held on the chuck table 51 is carried out, the chuck table 51 holding the semiconductor wafer 2 is moved to the cutting start position of the cutting area. Then, the cutting blade 521 is moved down while it is rotated in the direction shown by the arrow 521a to carry out a cutting-in feed of a predetermined distance. This cutting-in feed position is set to the depth position (for example, 110 μm) of the outer periphery of the cutting blade 521 corresponding to the final thickness from the front surface of the semiconductor wafer 2. After the cutting-in feed of the cutting blade 521 is carried out as described above, the chuck table 51 is moved (cutting-fed) in the direction shown by the arrow X while the cutting blade 521 is rotated, whereby a dividing groove 230 having a depth corresponding to the final thickness (for example, 110 μm) of each device is formed along the predetermined dividing line 21 as shown in FIG. 13(b) (dividing groove forming step). This dividing groove forming step is carried out along all the dividing lines 21 formed on the semiconductor wafer 2.

After the dividing grooves 230 having a predetermined depth are formed along the dividing lines 21 in the front surface 2a of the semiconductor wafer 2 by the above dividing groove forming step, a protective member 8 for grinding is put onto the front surface 2a (that is a surface having the device 22 formed thereon) of the semiconductor wafer 2 as shown in FIG. 14(a) and FIG. 14(b) (protective member affixing step). A polyolefin sheet having a thickness of 150 μm is used as the protective member 8 in the illustrated embodiment.

Thereafter, the rear surface 2b of the semiconductor wafer 2 having the protective member 8 on the front surface 2a thereof is ground to expose the dividing grooves 230 to the rear surface 2b, thereby dividing the semiconductor wafer 2 into the individual devices (dividing groove exposing step). This dividing groove exposing step is carried out by using a grinder 9 comprising a chuck table 91 and a grinding means 93 having a grindstone 92 as shown in FIG. 15(a). That is, the semiconductor wafer 2 is held on the chuck table 91 in such a manner that the rear surface 2b faces up, and the grindstone 92 of the grinding means 93 is rotated at 6,000 rpm and brought into contact with the rear surface 2b of the semiconductor wafer 2 while the chuck table 91 is rotated at 300 rpm, for example, to grind the rear surface 2b until the dividing grooves 230 are exposed to the rear surface 2b as shown in FIG. 15(b). By thus grinding until the dividing grooves 230 are exposed, the semiconductor wafer 2 is divided into the individual devices 22 as shown in FIG. 15(c). Since the obtained devices 22 have the protective member 8 on the front surfaces, they do not fall apart and the form of the semiconductor wafer 2 is maintained.

After the semiconductor wafer 2 is divided into the individual devices 22 by the above pre-dicing technique, next comes the step of bonding an adhesive film for die bonding to the rear surface 2b of the semiconductor wafer 2 divided into the individual devices 22. That is, as shown in FIGS. 16(a) and 16(b), the adhesive film 3 is bonded to the rear surface 2b of the semiconductor wafer 2 divided into the individual devices 22. At this point, the adhesive film 3 is pressed against the rear surface 2b of the semiconductor wafer 2 under heating at 80 to 200° C. to be bonded to the rear surface 2b as described above.

Figure 17:
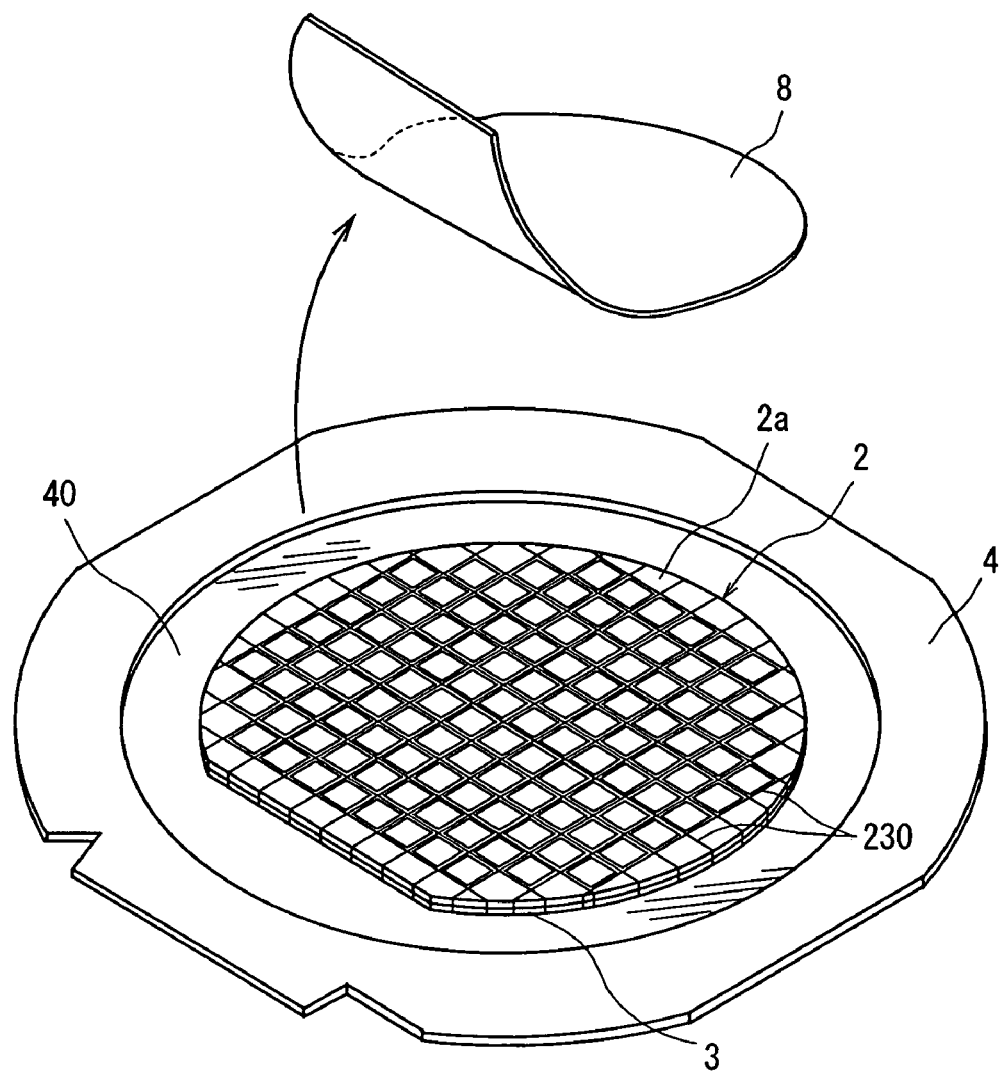
FIG. 17 is a perspective view of the wafer showing another example of the wafer supporting step in the method of dividing an adhesive film bonded to a wafer according to the present invention.
Figure 18:
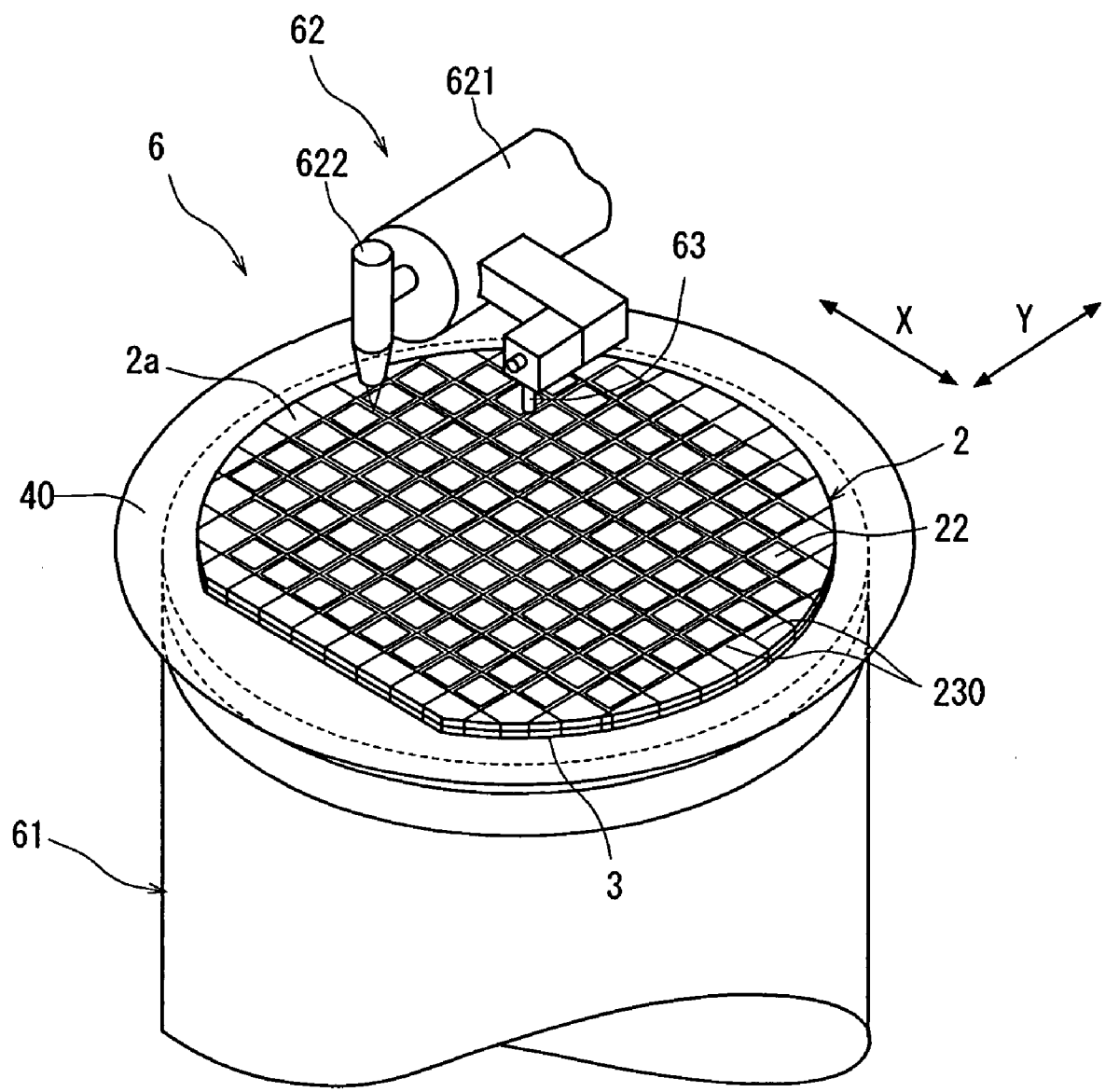
FIG. 18 is a perspective view of the laser beam processing machine showing another example of the cutting step in the method of dividing an adhesive film bonded to a wafer according to the present invention by using the laser beam processing machine shown in FIG. 8.

The above adhesive film bonding step is followed by the step of putting the adhesive film 3 side of the semiconductor wafer 2 having the adhesive film 3, on the front surface of the dicing tape 40 mounted on the annular frame 4 as shown in FIG. 17. Then, the protective member 8 affixed to the front surface 2a of the semiconductor wafer 2 is removed (protective member removing step). After the protective member 8 is removed, next comes the step of cutting the adhesive film 3 affixed to the dicing tape 40 into pieces corresponding to the devices incompletely in such a way that an uncut portion is caused to remain. This cutting step can be carried out by using the laser beam processing machine 6 shown in FIG. 8. That is, as shown in FIG. 18, the dicing tape 40 side of the semiconductor wafer 2 bonded to the front surface of the dicing tape 40 through the adhesive film 3 is placed and suction-held on the chuck table 61 as shown in FIG. 18. Therefore, the front surface 2a of the semiconductor wafer 2 faces up. Although the annular frame 4, on which the dicing tape 40 is mounted, is not shown in FIG. 18, the annular frame 4 is held by the suitable frame holding means provided on the chuck table 61.

Figure 19:
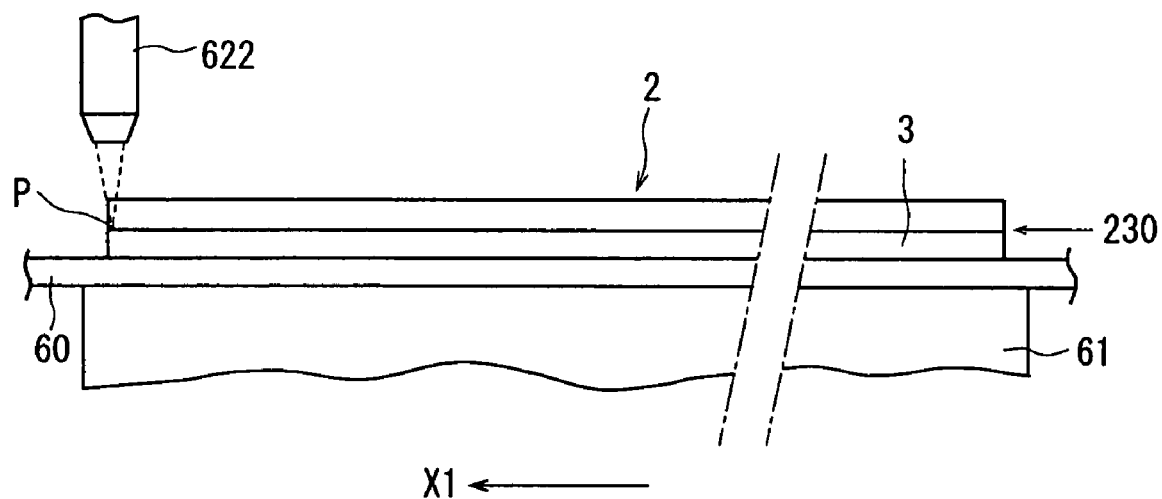
FIG. 19 is a principal diagram showing the cutting step shown in FIG. 18.
Figure 20:
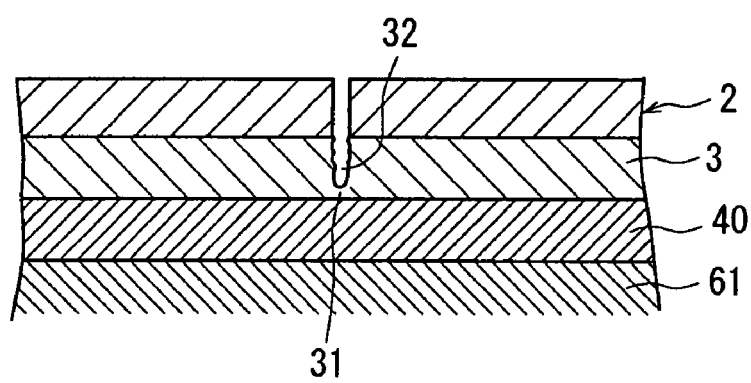
FIG. 20 is an enlarged sectional view of the semiconductor wafer which has been subjected to the cutting step shown in FIG. 18.

After the semiconductor wafer 2 is held on the chuck table 61 as described above, the above-described alignment work is carried out. The chuck table 61 is then moved to the laser beam application area where the condenser 622 of the laser beam application means 62 for applying a laser beam is located so as to bring one end (left end in FIG. 19) of a predetermined dividing groove 230 to a position right below the condenser 622 as shown in FIG. 19. The chuck table 61 is moved in the direction shown by the arrow X1 in FIG. 19 at a predetermined feed rate while a pulse laser beam is applied from the condenser 622 to the adhesive film 3 through the dividing groove 230 formed in the semiconductor wafer 2. When the other end (right end in FIG. 19) of the dividing groove 230 reaches the application position of the condenser 622, the application of the pulse laser beam is suspended and the movement of the chuck table 61 is stopped. At this point, the focal point P (point where a focal spot is formed) of the pulse laser beam applied from the condenser 622 of the laser beam application means 62 is set to the top surface of the adhesive film 3 in the illustrated embodiment. The wavelength of this laser beam is set to 355 nm which is absorbed by a film material composed of a mixture of an epoxy resin and an acrylic resin constituting the adhesive film 3. The processing conditions are set to ensure that the adhesive film 3 having a thickness of 90 µm is cut incompletely in such a way that an uncut portion having a depth of about 10 µm is caused to remain, in the illustrated embodiment. As a result, a groove 32 is formed along the dividing grooves 230 with the energy of the laser beam in the adhesive film 3, leaving the uncut portion 31.

The processing conditions in the above cutting step are set as follows, for example.

Type of laser beam: YVO4 laser or YAG laser
Wavelength: 355 nm
Repetition frequency: 50 kHz
Average output: 3 W
Diameter of focal spot: 9.2 µm
Processing-feed rate: 200 mm/sec By carrying out the above cutting step along all the dividing lines 21 formed on the semiconductor wafer 2 as described above, the adhesive film 3 is divided into pieces corresponding to the devices 22 incompletely, leaving the uncut portion 31. Therefore, the adhesive film 3 does not adhere to the dicing tape 40.

Figure 11:
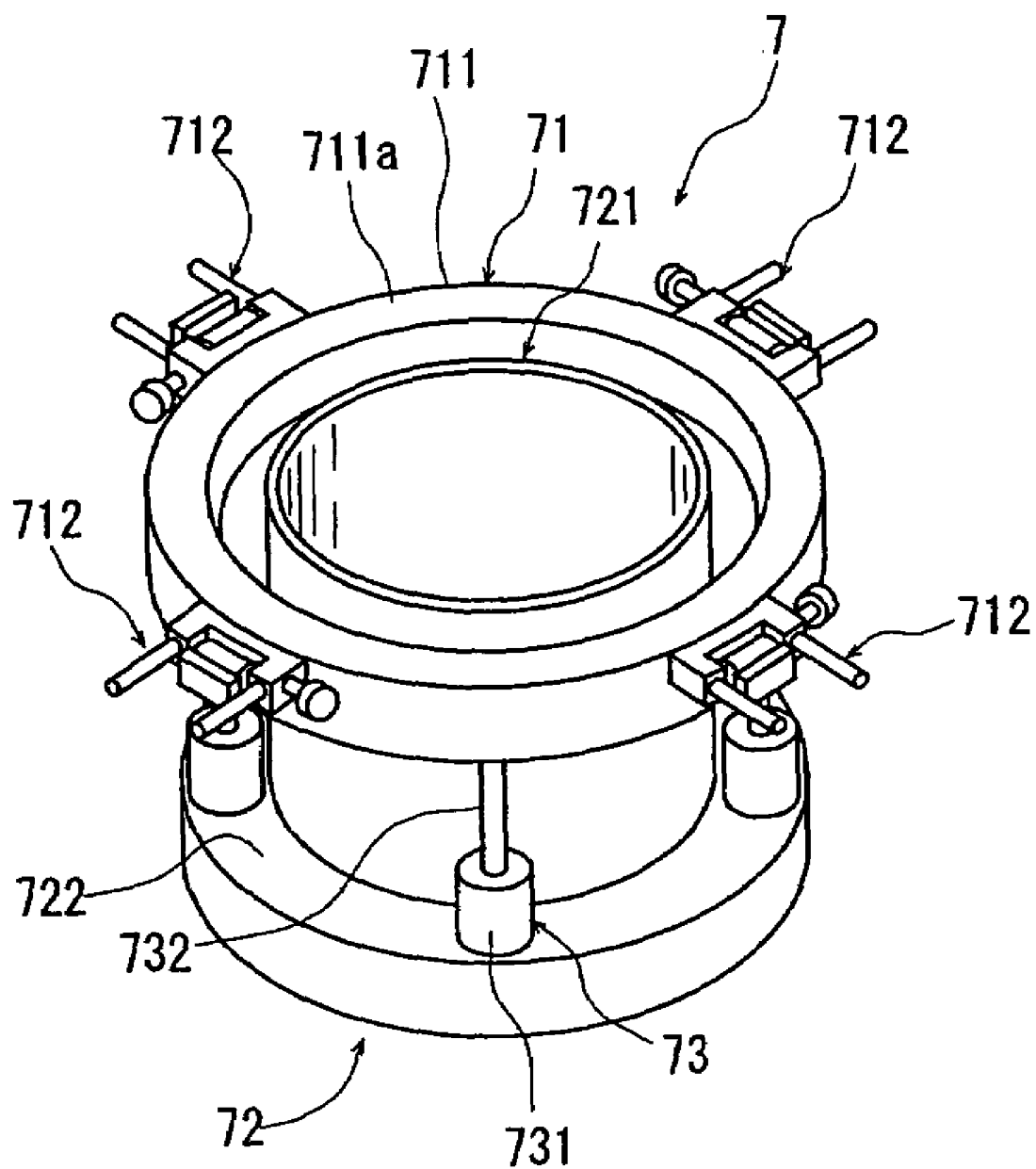
FIG. 11 is a perspective view of a tape expanding apparatus for carrying out the adhesive film dividing step in the method of dividing an adhesive film bonded to a wafer according to the present invention.
Figure 12:
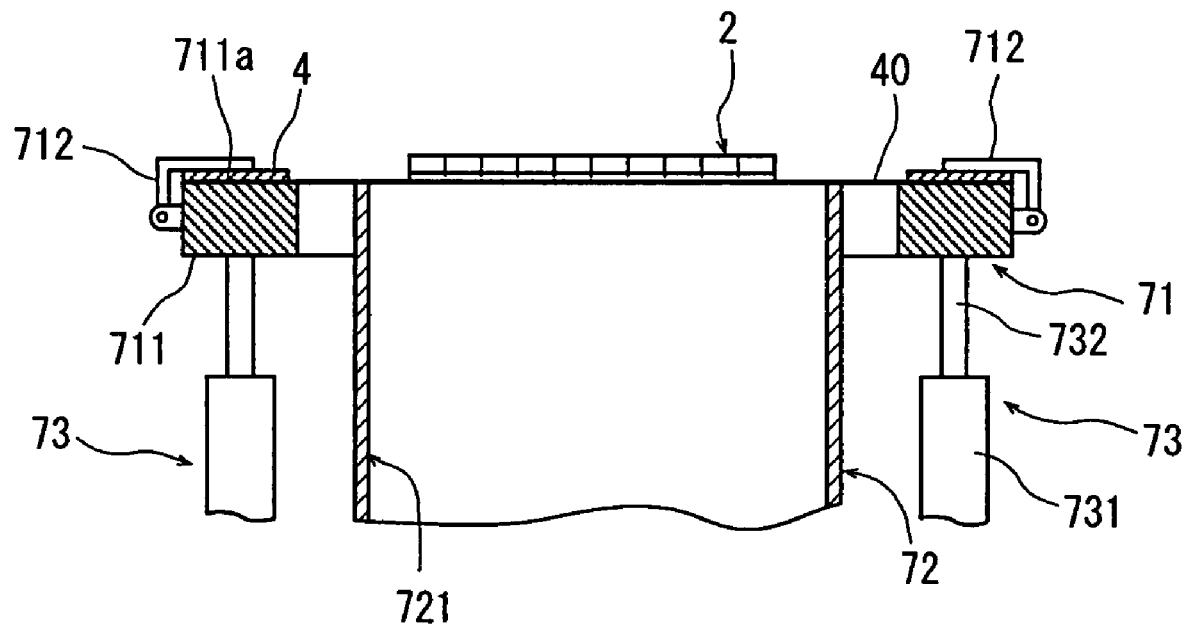
FIGS. 12(a) and 12(b) are explanatory diagrams showing a state in which the adhesive film dividing step in the method of dividing an adhesive film bonded to a wafer according to the present invention is carried out by using the tape expanding apparatus shown in FIG. 11.
Figure 12:
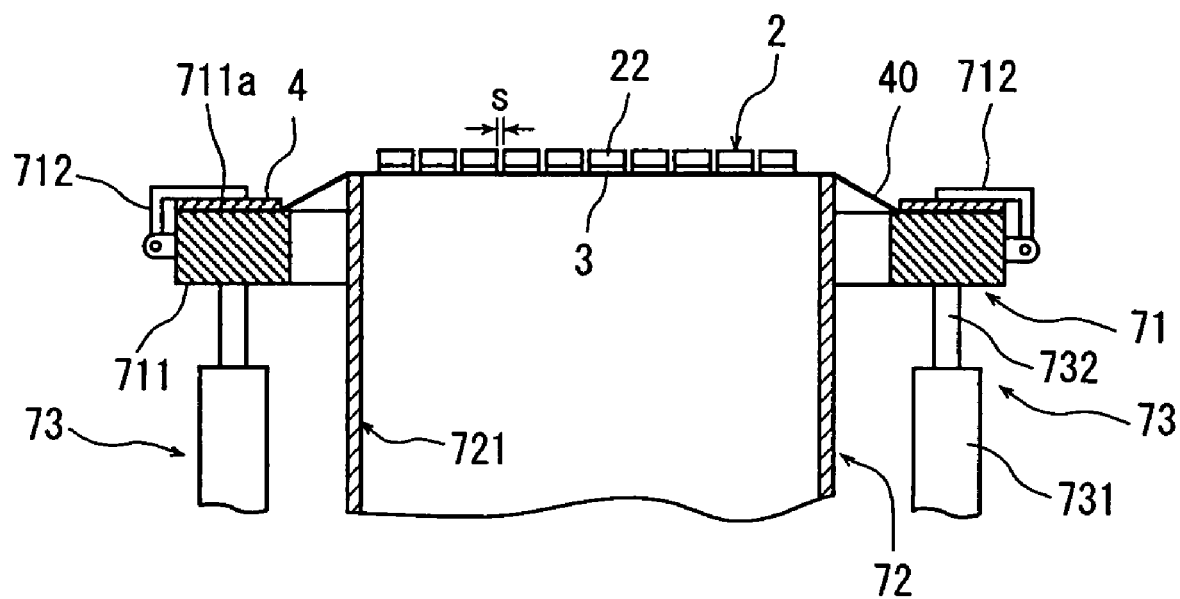

After the above cutting step, the adhesive film dividing step shown in FIG. 11 and FIGS. 12(*a*) and 12(*b*) is carried out.

What is claimed is:

1. A method of dividing an adhesive film for die bonding which is bonded to a rear surface of a wafer having devices in a plurality of areas sectioned by dividing lines formed in a lattice pattern on a front surface of the wafer, said method of dividing the adhesive film into pieces corresponding to the devices, and comprising the steps of:

putting the adhesive film side of the wafer on a front surface of a dicing tape mounted on an annular frame;

cutting through the wafer from the front surface into the adhesive film so as to separate the wafer into devices along the dividing lines and so as to cut the adhesive film only incompletely such that an uncut portion of the film is caused to remain; and expanding the dicing tape after the cutting step to divide the adhesive film into pieces corresponding to the devices.

2. The method of dividing an adhesive film bonded to a wafer according to claim 1, wherein the cutting step is carried out by using a cutting machine having a cutting blade.

3. The method of dividing an adhesive film bonded to a wafer according to claim 1, wherein the cutting step is carried out by using a laser beam processing machine for applying a pulse laser beam.

4. The method of dividing an adhesive film bonded to a wafer according to claim 1, wherein the thickness of the uncut portion of the adhesive film is set to 20 µm or less in the cutting step.

5. The method of dividing an adhesive film bonded to a wafer according to claim 1, wherein the adhesive film dividing step is to expand the dicing tape by cooling the adhesive film to reduce its elasticity.

\* \* \* \* \*